United States Patent
Welch et al.

(10) Patent No.: US 6,592,673 B2
(45) Date of Patent: *Jul. 15, 2003

(54) APPARATUS AND METHOD FOR DETECTING A PRESENCE OR POSITION OF A SUBSTRATE

(75) Inventors: Michael D. Welch, Livermore, CA (US); Harald Herchen, San Jose, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/322,102

(22) Filed: May 27, 1999

(65) Prior Publication Data

US 2002/0078889 A1 Jun. 27, 2002

(51) Int. Cl.⁷ .............................. B05C 11/00; C23F 1/10
(52) U.S. Cl. ..................... 118/676; 118/715; 118/668; 118/728; 156/345.24; 156/345.51
(58) Field of Search ................................. 250/548, 235; 361/212, 416; 430/22; 134/1.1; 15/302; 356/369, 73; 257/347, 434, 619, 698, 773, 776, 778; 385/115, 123; 438/107, 108, 110, 157, 25, 27, 411; 156/345

(56) References Cited

U.S. PATENT DOCUMENTS

| 4,233,625 A | * | 11/1980 | Altman .......................... 348/87 |
| 4,293,249 A | * | 10/1981 | Whelan ......................... 406/33 |
| 4,503,335 A | * | 3/1985 | Takahashi ..................... 250/548 |
| 4,600,309 A | * | 7/1986 | Fay ............................. 356/401 |
| 4,657,620 A | | 4/1987 | Davis et al. ................. 156/345 |
| 4,776,744 A | | 10/1988 | Stonestreet et al. .......... 414/217 |
| 4,789,803 A | * | 12/1988 | Jacobsen et al. ............. 310/309 |
| 4,836,733 A | | 6/1989 | Hertel et al. ................. 414/225 |
| 4,845,373 A | * | 7/1989 | Jamieson et al. ............. 250/548 |
| 4,907,035 A | | 3/1990 | Galburt et al. ............... 356/150 |
| 5,044,752 A | | 9/1991 | Thurfjell et al. ............. 356/400 |
| 5,134,436 A | * | 7/1992 | Fujioka ......................... 355/30 |
| 5,310,624 A | * | 5/1994 | Ehrlich ......................... 430/322 |
| 5,442,163 A | | 8/1995 | Nakahara et al. ............. 235/381 |
| 5,483,138 A | | 1/1996 | Shmookler et al. ....... 318/568.16 |
| 5,563,798 A | | 10/1996 | Berken et al. ............. 364/478.06 |
| 5,565,034 A | * | 10/1996 | Nanbu et al. ................ 118/668 |

(List continued on next page.)

FOREIGN PATENT DOCUMENTS

JP 361056416 A * 3/1986 ............. C23F/4/00

OTHER PUBLICATIONS

Akihiro Hosokawa, et al, "Real–time substrate misalignment monitor and automatic recalibration", J. Vac. Sci. Tech. A (16), 3, pp. 1921–1925.*

Primary Examiner—Jeffrie R. Lund
Assistant Examiner—Rudy Zervigon
(74) Attorney, Agent, or Firm—Ashok Janah; Joseph Bach

(57) ABSTRACT

A chamber 25 comprises a support 45 for holding a substrate 20 and a sensor system 135 adapted to detect the presence or proper placement of the substrate 20 on the support 45. The support 45 comprises a window 155 that is transparent and adapted to transmit light therethrough. The sensor system 135 comprises a light source 140 adapted to direct a light beam 150 through the window 155 and a light sensor 160 in the path of the light beam 150. The light beam 150 is sensed by the light sensor 135 when the substrate 20 is properly positioned and the light beam 150 is blocked from the light sensor 135 when the substrate 20 is improperly positioned or vice versa. Preferably, the support 45 comprises an electrostatic chuck 55 adapted to electrostatically hold the substrate 20, the electrostatic chuck 55 comprising a window 155 composed of transparent material or a cut-out or a hole therein.

32 Claims, 4 Drawing Sheets

U.S. PATENT DOCUMENTS

| | | | | |
|---|---|---|---|---|
| 5,737,064 A | * | 4/1998 | Inoue et al. | 355/73 |
| 5,956,837 A | * | 9/1999 | Shiota et al. | 29/559 |
| 5,982,986 A | * | 11/1999 | Davenport | 392/418 |
| 5,990,650 A | * | 11/1999 | Brock | 318/640 |
| 5,997,175 A | * | 12/1999 | Champetier et al. | 374/126 |
| 5,998,801 A | * | 12/1999 | Imai | 250/548 |
| 5,999,012 A | * | 12/1999 | Listwan | 324/770 |
| 6,004,828 A | * | 12/1999 | Hanson | 438/7 |
| 6,085,125 A | * | 7/2000 | Genov, deceased | 700/218 |
| 6,162,008 A | * | 12/2000 | Perkins et al. | 414/754 |
| 6,207,926 B1 | * | 3/2001 | Xuan | 219/121.68 |
| 6,275,742 B1 | * | 8/2001 | Sagues et al. | 700/213 |
| 6,489,624 B1 | * | 12/2002 | Ushio et al. | 250/559.27 |

* cited by examiner

APPARATUS AND METHOD FOR DETECTING A PRESENCE OR POSITION OF A SUBSTRATE

BACKGROUND

The present invention relates to an apparatus and method for detecting a presence or position of a substrate on a support.

In the fabrication of integrated circuits, flat panels, and electrical circuits, electronic devices are formed by depositing and etching layers on a substrate. In these processes, the substrate is transferred by a robot from a substrate holder to a support in a chamber. The robot extends a blade into a slot of the substrate holder, lifts up the substrate, moves the substrate to a support in the chamber, and lowers the substrate onto lift pins that extend through the support. The lift pins descend to place the substrate on the support. Thereafter, process gas is provided in the chamber and energized by RF or microwave energy to process the substrate.

In these methods, it is desirable to detect the presence and position of the substrate on the support because a misplaced substrate can lead to inferior processing of, or damage to, the substrate. Such improper positioning can occur when the substrate is displaced in its slot in the substrate holder and is picked up a skewed position by the blade. The substrate can also shift position on the blade during transportation. In addition, the substrate can move while resting on the descending lift pins due to ambient vibrations. Such improper positioning is often not discovered until the substrate is fully processed and is already damaged. For example, in photolithography, the substrate has to be precisely oriented; otherwise, the pattern of light projected onto the substrate is distorted or skewed. A misplaced substrate can also result in disparate heat transfer rates across the backside of the substrate which result in non-uniform processing rates across the front face of the substrate. Also, heat transfer gas held below the substrate can leak out at inconsistent rates from below the edge of the substrate if the seal with the overlying substrate is not uniformly gas tight across the backside of the substrate.

Thus there is a need for an apparatus and method to determine a presence of a substrate on a support. It is also desirable to detect proper positioning of the substrate prior to clamping down or otherwise initiating processing of the substrate to avoid damaging the substrate. It is further desirable to securely hold the substrate after it is properly positioned.

SUMMARY

An apparatus and method according to the principles of the present invention are capable of, detecting a presence of the substrate, and optionally, determining whether a substrate is properly positioned on a support. The apparatus comprises a support adapted to support the substrate, the support comprising a window. A radiation source is adapted to direct radiation through the window in the support. A radiation sensor is provided in a path of the radiation, the radiation sensor adapted to detect a presence of the substrate on the support by measuring a property of the radiation.

In another aspect, the present invention comprises a chamber for processing a substrate, the chamber comprising a gas distributor having a nozzle adapted to introduce process gas into the chamber. An electrostatic chuck in the chamber comprises a surface adapted to receive the substrate, and a window adapted to transmit radiation therethrough. A radiation source is adapted to pass radiation through the window of the electrostatic chuck. A radiation sensor in a path of the radiation is adapted to detect the substrate on the surface of the electrostatic chuck by measuring a property of the radiation.

In yet another aspect, the present invention comprises a chamber for processing a substrate, the chamber comprising a gas distributor having a nozzle adapted to introduce process gas in the chamber; a support having a surface adapted to receive the substrate; and means for sensing a presence of the substrate on the support by detecting a radiation passing through the support.

In yet another aspect, the present invention comprises an electrostatic chuck for holding a substrate. The electrostatic chuck comprises a dielectric having a surface adapted to receive a substrate, the dielectric covering an electrode that is chargeable to electrostatically hold the substrate, and the dielectric comprising a window.

In another aspect, the present invention comprises a method for detecting a presence of a substrate on a support in a chamber, the method comprising the steps of placing the substrate on the support, passing radiation through the support, detecting the radiation to determine a presence of the substrate on the support.

In another aspect, the present invention comprises a method of detecting a presence of a substrate on a support in a chamber, the method comprising steps of placing the substrate on a support in the chamber; passing a light beam through a window in the support; and detecting the light beam transmitted through the window to detect a presence of the substrate on the support.

DRAWINGS

These and other features, aspects, and advantages of the present invention will be better understood from the following drawings, description and appended claims, which illustrate examples of the invention, where:

FIG. 3b is a schematic sectional top view of the electrostatic chuck of FIG. 3a;

DESCRIPTION

Figure 1:
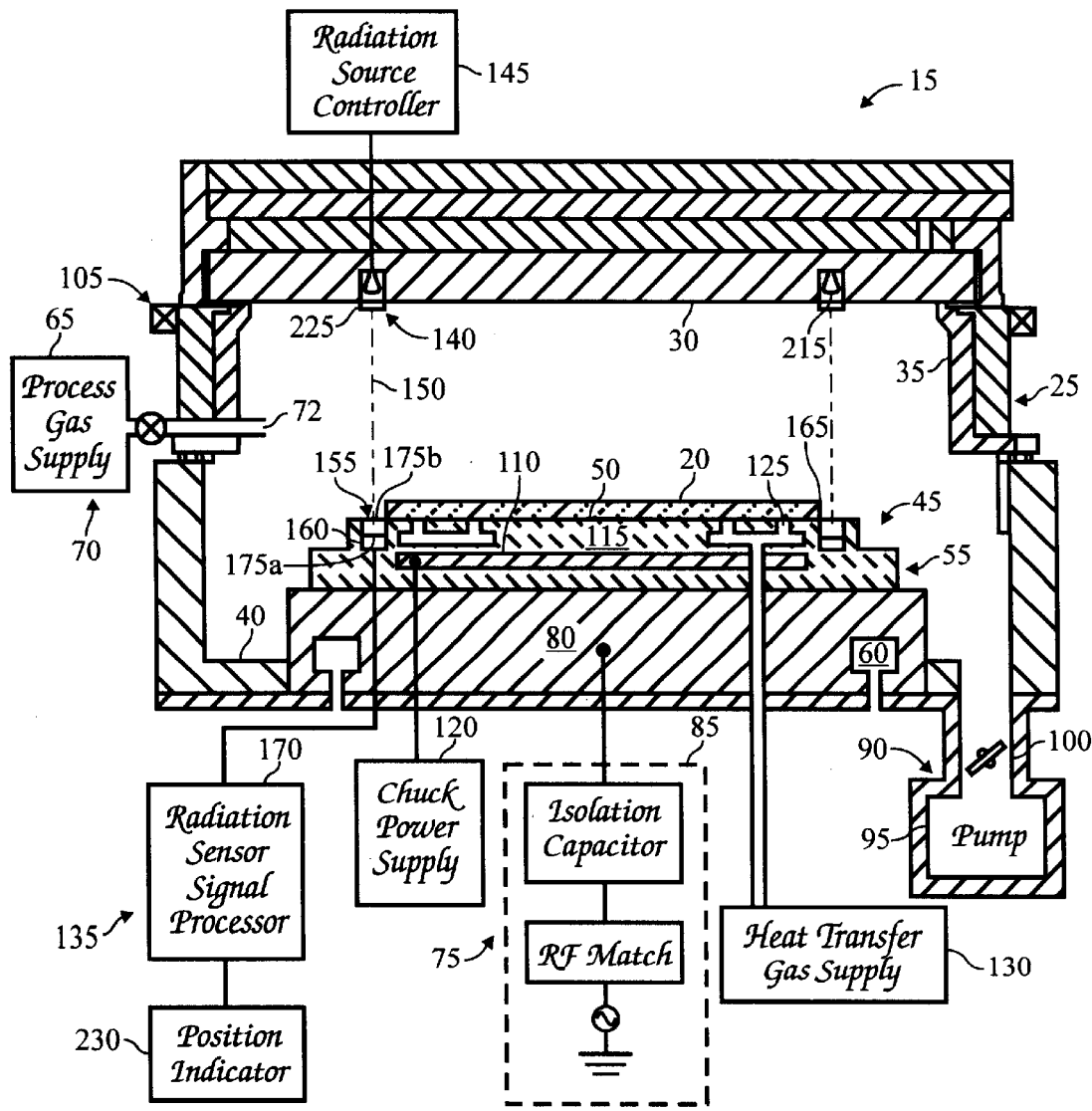
FIG. 1 is a schematic sectional view of an apparatus according to the present invention, the apparatus comprising a chamber, support, and sensor system.

Operation of the present invention is illustrated by an apparatus 15 for processing a substrate 20, such as a semiconductor wafer, as schematically illustrated in FIG. 1. The apparatus 15 comprises a chamber 25 having a ceiling 30, sidewalls 35, and a bottom wall 40 upon which rests a support 45. The support 45 comprises a chuck 55 having a receiving surface 50 for supporting and holding the substrate 20. The chuck 55 can be a vacuum chuck, mechanical chuck or electrostatic chuck. Optionally, the support 45 can further comprise channels 60 through which a heat transfer fluid is circulated to control the temperature of the support 45 during processing of the substrate 20. Although the present invention is illustrated in the context of a chuck 55 for holding a substrate 20 in a chamber 25, the invention can also be used for holding and detecting proper positioning of other substrates 20, such as circuit boards, flat panel displays, and liquid crystal displays as apparent to those skilled in the art and without deviating from the scope of the invention. Thus the present invention should not be limited to the illustrative embodiments of the invention described herein.

During operation, process gas is provided from a nozzle 72 of a process gas distributor 70 into the chamber 25. The process gas distributor 70 is fed by a process gas supply 65. The process gas is energized to form an energized gas or plasma by a gas energizer 75 that couples RF or microwave energy into the process gas in the chamber 25. In the exemplary chamber 25 shown in FIG. 1, the gas energizer 75 comprises a pair of process electrodes formed by the ceiling 30 and an electrically conducting portion 80 of the support 45, which are electrically biased relative to one another by a voltage supply 85, to capacitively couple RF energy to the process gas. In addition, an inductor coil (not shown) adjacent to the chamber 25 can also be used to inductively couple RF power to the process gas in the chamber 25. Alternatively, a microwave source in a remote chamber (also not shown) can be used to energize or activate the process gas before introduction into the chamber 25. An exhaust system 90 comprising one or more exhaust pumps 95 and a throttle valve 100 is used to exhaust spent process gas and to control the pressure of the process gas in the chamber 25.

Optionally, the chamber 25 further comprises a magnetic field generator 105, such as a set of permanent magnets or electromagnetic coils, which apply a magnetic field to the plasma to contain the plasma or to increase its density and uniformity. Preferably, the magnetic field generator 105 comprises electromagnet coils spaced symmetrically about the chamber 25. The magnetic field generator 105 provides a rotating magnetic field with the axis of the field rotating parallel to the plane of the substrate 20, as described in U.S. Pat. No. 4,842,683, issued Jun. 27, 1989, which is incorporated herein by reference.

A substrate 20 is placed on the receiving surface 50 of the support 45 in the chamber 25. Preferably, the support 50 comprises an electrically conducting portion 80 supporting an electrostatic chuck 55. The electrostatic chuck 55 comprises an electrode 110 covered by or embedded in a dielectric 115 that electrically isolates the electrode 110 from the substrate 20. Electrostatic charge accumulates in the electrode 110 or dielectric 115 when the electrode 110 is electrically biased with respect to the substrate 20 by a power supply 120. In a monopolar electrostatic chuck 55, the plasma in the chamber 25 provides electrically charged species that accumulate in the substrate 20 to generate an electrostatic attractive force that holds the substrate 20. In a bipolar electrostatic chuck, one or more pairs of electrodes (not shown) are each charged to a different electrical potential to generate electrostatic forces between the electrodes 110 and the substrate 20. Typically, the electrostatic chuck 55 also comprises grooves 125 in which a heat transfer gas, such as helium, is held to enhance thermal coupling between the substrate 20 and the chuck 55. The heat transfer gas is provided by a heat transfer gas supply 130.

The presence of the substrate 20 on the support 45 is detected and optionally, its position monitored by a sensor system 135. Generally, as shown in FIG. 1, the sensor system 135 comprises a radiation source 140 adapted to pass radiation 150 through a window 155 in the support 45. The radiation source 140 comprises a source of radiation, such as for example, ultraviolet light, infra-red light, visible light, or X-ray radiation. The radiation source 140 can provide radiation having only a predominant wavelength, such as a monochromatic light having radiation primarily at a single or a few wavelengths, for example, a He—Ne or Nd-YAG laser. Alternatively, the radiation source 140 can provide multiple wavelengths of radiation, such as polychromatic light, which are filtered to selectively provide substantially only a single wavelength. Suitable radiation sources 140 for providing polychromatic light include Hg discharge lamps that generate a polychromatic spectrum of light having wavelengths in the range of from about 200 to about 600 nanometers, arc lamps such as xenon or Hg—Xe lamps and tungsten-halogen lamps; and light emitting diodes (LED). The radiation source 140 can also comprise an emission from a plasma generated inside the chamber 25, the plasma emission being generally multispectral, i.e., providing radiation having multiple wavelengths across an entire spectrum. Preferably, the radiation source 140 comprises a source of light, such as a lamp, light emitting diode or laser. The radiation source 140 can be operated or controlled by a radiation source controller 145 that, for example, controls the intensity of the radiation emitted by the radiation source 140 or controls turning on and off the radiation source 140. For example, the radiation source controller 145 can include a variable resistance element or variable voltage source to control the intensity of a radiation source 140 such as a lamp.

The sensor system 135 also comprises a radiation sensor 160 in a path of the radiation 150 to measure a change in property of the radiation, such as for example, a change in intensity or phase of the radiation 150, that results when a substrate 20 is present on the support 20. The radiation sensor 160 comprises a radiation detector, such as a photovoltaic cell, photodiode, photomultiplier, or phototransistor, which provides an electrical output signal in response to a measured intensity of radiation 150. The signal can comprise a change in the level of a current passing through an electrical component or a change in a voltage applied across an electrical component. A radiation signal sensor signal processor 170 is used to process the signal output of the radiation sensor 160, for example, by amplifying the output signal or by processing the signal to increase a signal to nose ratio.

In one version, the radiation source 140 is adapted to direct radiation 150 through the window 155 in the support 20 such that at least a portion of the radiation 150 reaches the radiation sensor 160 when the substrate 20 is properly positioned and a lower intensity of radiation reaches the radiation sensor 160 when the substrate 20 is improperly positioned, or vice versa. For example, the radiation sensor 160 can be positioned in the chamber 25 to receive radiation 150 when the substrate 20 is properly positioned and to be shielded from the radiation 150 by the substrate 20 when the substrate 20 is improperly positioned. Preferably, the radiation source 140 is adapted to direct a beam of the radiation 150 in a path adjacent to a peripheral edge 165 of a properly positioned substrate 20 to provide a more sensitive and accurate method of monitoring a position of the edge of the substrate 20.

Optionally, when the radiation 150 is partially or entirely blocked by a substrate 20 that is improperly positioned, the radiation sensor 160 provides a signal to an indicator 165 outside the chamber 25, that indicates a presence or position of the substrate 20 on the support 45 for an operator. The indicator 165 can be monitored during the process to determine proper placement of the substrate, or if the substrate 20 moves during processing, to terminate the process before the entire substrate 20 is damaged. For example, the indicator 165 can be activated when a sufficient intensity of radiation 150 is incident on the radiation sensor 160. A suitable indicator 165 comprises a light emitting diode or meter activated by a signal from the radiation sensor 160.

The sensor system 135 passes the radiation 150 through a window 155 in the support 45, the window 155 being substantially transparent to the radiation 150. By substantially transparent it is meant that the window 155 transmits a detectable intensity of radiation 150 therethrough. Preferably, to prevent scattering or reflection of radiation 150, such as light, transmitted through the window 155 both surfaces 175a,b of the window are polished smooth with a peak to peak RMS roughness (the vertical distance between the peaks and valleys of the surface roughness of the window 155) of less than about 1 μm, and more preferably less than about 0.1 μm. The surfaces 175a,b of the window 155 can be polished by flame polishing, lapping or ablating methods. In addition, the surfaces 175a,b of the window 155 are machined substantially parallel to one another to avoid refraction or rejection of radiation 150 passing through the window 155. The window can have a circular, rectangular, or polygonal shape. Preferably, the shape and size of the window 155 is selected to increase an area of transmission of radiation 150 to maximize the amount of radiation incident upon the radiation sensor 160. The window 155 is made from a material that is chemically resistant to erosion by the process gas used to process the substrate 20 in the chamber 25 so that the window surfaces 175a,b remain smooth and transparent, even after processing a large number of substrates 20. Preferably, the material of the window 155 is also capable of withstanding the thermal stresses arising in the processing environment without cracking or forming contaminant particles. More preferably, the coefficient of thermal expansion of the window 155 closely matches the coefficient of thermal expansion of the support 45 to reduce thermal stresses that could damage the support 45. Suitable materials for fabricating the window 155 include ceramic materials, such as silicon dioxide, aluminum oxide, or aluminum nitride.

Figure 2:
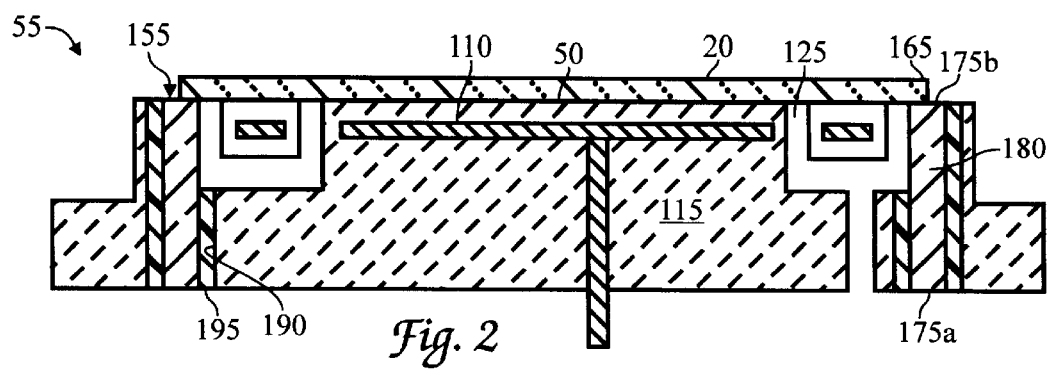
FIG. 2 is a schematic sectional side view of an electrostatic chuck according to the present invention.

In one version, as illustrated in FIG. 2, the window 155 comprises a transparent insert 180 bonded in a hole 190 in an electrostatic chuck 55 of a support 45. The window insert 180 is bonded in the dielectric 115 of the chuck 55 by a bonding agent 195, such a polyamide or polyimide adhesive. A small gap (not shown) is maintained between the side of the hole 190 and the insert 180 to introduce the bonding agent 195 and to allow for a thermal expansion mismatch that arises from the differences in thermal expansion of the insert 180 and dielectric 115. The window 155 can also be fabricated by making a preform from a ceramic material, positioning the window insert 180 in the ceramic preform, and sintering the preform to form the chuck 55. The window insert 180 is exposed by machining off a surface layer of the chuck 55. Thereafter, the surface of the window insert 180 can be polished to the desired roughness level. In another embodiment illustrated in FIGS. 3a and 3b, the window 155 comprises a polished portion of the electrostatic chuck 55 of the support 45. For example, the window 155 can comprise a polished portion 200 of the dielectric 115 of the electrostatic chuck 55. The polished portion 200 is obtained by polishing the upper and lower surfaces 205a,b to reduce the reflection and attenuation of radiation transmitted therethrough.

Preferably, the window 155 comprises a monocrystalline material, by which it is meant a crystalline material that comprises large crystals oriented in similar crystallographic directions or that have crystallographic planes with Miller indices aligned to one another. The monocrystalline materials are generally more transparent than polycrystalline materials which have smaller crystals that tend to scatter light or other electromagnetic radiation more readily. Also, the polycrystalline materials are more difficult to polish because the smaller crystals separate and fragment at the surface. In addition, monocrystalline materials are generally more homogeneous than polycrystalline materials which contain mixed phases at the grain boundaries between the smaller crystals. Such homogeneous materials have a more selective and predictable absorption spectra and are capable of transmitting radiation having particular wavelengths with less attenuation than equivalent polycrystalline materials. Preferably, the monocrystalline material comprises a monocrystalline ceramic, and more preferably comprises sapphire which is a single crystal form of alumina that provides a relatively low absorption of light having wavelengths in the range of from about 200 to about 5000 nm.

Figure 5:
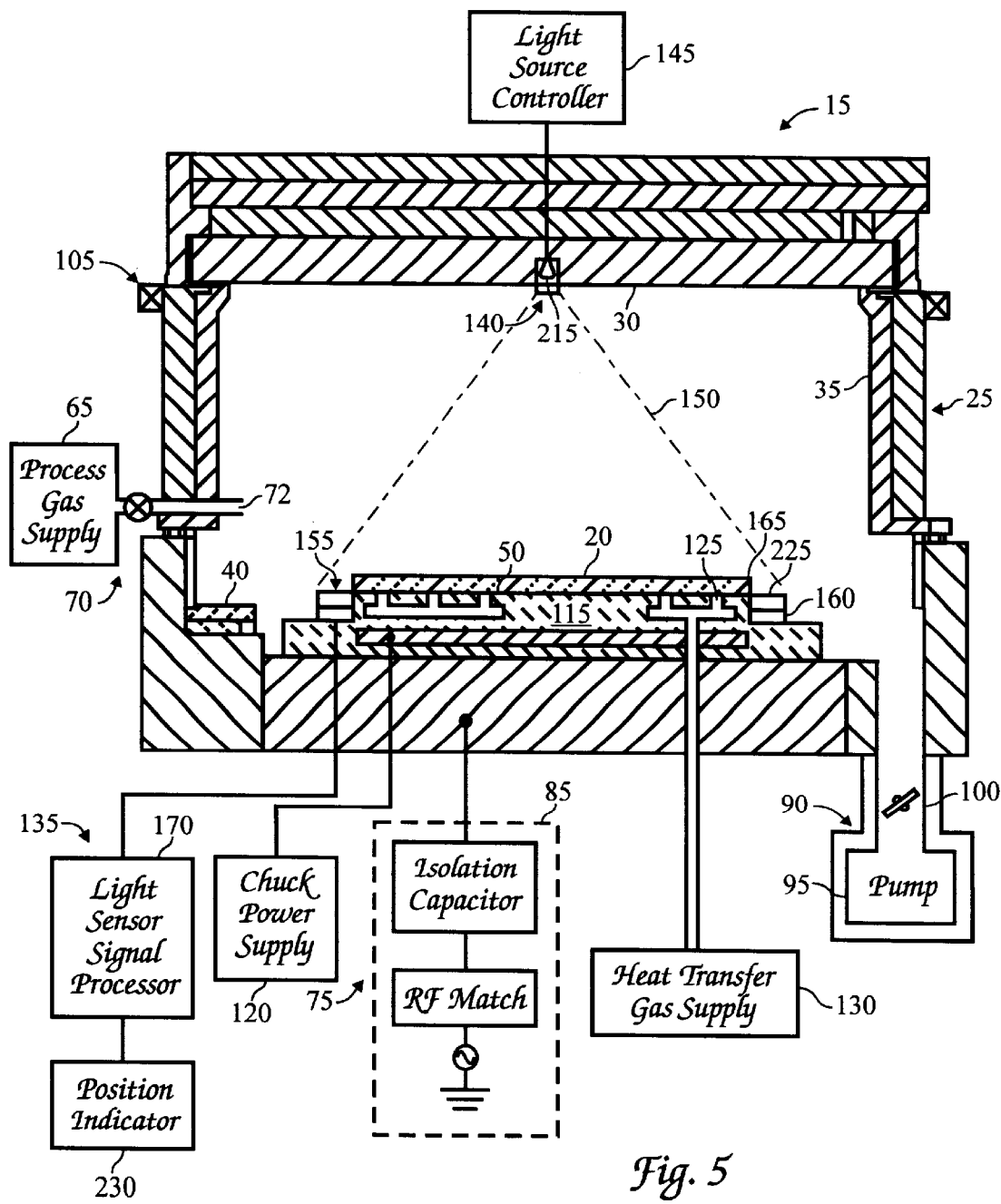
FIG. 5 is a schematic sectional view of another embodiment of a chamber and a sensor system according to the present invention.

In one version, the sensor system 135 senses the positioning of the substrate 20 on the support 45 by monitoring radiation 150 comprising light from one or more light sources 215 positioned above the support 45, as shown in FIG. 1. Each light source 215 projects a light beam 150 having a cross-sectional area that is sized to be transmitted through a window 155. In another version, as shown in FIG. 5, a single light source 215 is positioned above the center of the support 45 to project light over the entire receiving surface 50 of the electrostatic chuck 55. This projected light is transmitted through one or more windows 155 each having a small light sensor 160 immediately below the window to detect whether a substrate 20 is properly positioned. In either embodiment, the area and intensity of the light that reaches the light sensor 160 both should be sufficiently large to generate a signal having a good signal to noise ratio.

In both these versions, the light source 215 provides a monochromatic or polychromatic light having a sufficiently high intensity to be transmitted through the window 155 to fall upon and generate a signal from the light sensor 160. More preferably, the source 215 provides wavelengths that are different from the frequencies of the spectral emission of the plasma in the chamber 25 to increase the signal to noise ratio. For example, the light source 215 can comprise a source of polychromatic light, such as a Hg—Cd lamp, that provides an emission spectrum of light having wavelengths of from about 200 to about 600 nanometers. Polychromatic light can be filtered to provide light having a selected range of wavelengths. The filters 225 are placed in front of the light source 215 to filter out all wavelengths except those in the desired range so that only light having particular wavelengths is transmitted to the light sensor 160, as for example, shown in FIG. 1. Alternatively, the light source 215 provides monochromatic light having a small number of wavelengths, for example, a He—Ne or Nd-YAG laser, having an emission spectrum of light with wavelengths of from about 248 to about 633 nm. The light source is operated by a light source controller 145.

In this version, the radiation sensor 160 comprises a light sensor 220 having a light detecting surface (not shown). The light sensor 220 comprises a light sensitive electronic component, such as a photovoltaic cell, photodiode, or phototransistor, which provides a signal when light falls on the light detecting surface of the light sensor 220. Generally, the signal is in the form of a change in level of a current passing through the light sensor 160 or a change in a voltage applied across the light sensor 160, the signal being subsequently processed by a light signal processor 170. The light sensor 160 is positioned and oriented so that its light detecting surface faces the light source 215 through the window 155. The light sensor 160 can be positioned above or below the window 155. For example, when a light source 215 is positioned in the support 45 below the window 155 and provides a focused beam of light through the window 155, the light sensor 160 can be positioned in the ceiling 30 above the window 155. As another example, for a light source 215 positioned in the ceiling 30, as shown in FIG. 1, the light sensor 160 is positioned below the window 155. Alternatively, when the light source 215 projects a light beam that spreads out over the receiving surface 50, as shown in FIG. 5, the light sensor 160 is positioned below the window 155 in the support 45.

Operation of a sensor system 135 on a support 45, according to the present invention, will be described with reference to FIGS. 1 and 2, and in the context of holding a substrate 20 in a chamber 25. During processing, the substrate 20 is placed onto the receiving surface 50 of an electrostatic chuck 55 of a support 45, and the chamber 25 is evacuated to a low pressure. A light beam 150 from a light source 215 is directed along a path that passes adjacent to a peripheral edge 165 of a properly positioned substrate 20, through a window 155, and is incident on a light sensor 160. When a substrate 20 is improperly positioned on the support 45, the edge 165 of the substrate 20 covers up and blocks the light beam 150 from passing through the window 155 so that a lower intensity of light strikes the light detecting surface of the light sensor 160. When a substrate 20 is properly positioned, the light sensor 160 provides a strong signal because sufficient light reaches the light sensor 160. When the substrate is misplaced or improperly positioned on the support 45, the light sensor 160 receives less light and provides a weaker signal that can be used to indicate misplacement or movement of the substrate 20.

Upon sensing a presence of the substrate 20 on the support 45, a DC clamping voltage is applied to the electrode 110 of the electrostatic chuck 55 to clamp the substrate 20 to the receiving surface 50 of the electrostatic chuck 55, and helium is supplied through the grooves 125 in the receiving surface 50 to control the temperature of the substrate 20. Once the substrate 20 is securely held on the electrostatic chuck 55, the gas distributor 70 introduces the process gas into the chamber 25, the chamber 25 is maintained at the desired gas pressure, and the process gas is energized by the gas energizer 75 to process the substrate 20. Spent process gas and etchant byproducts are exhausted from the chamber 25 through the exhaust system 90. After completion of processing, the voltage applied to the electrode 110 of the electrostatic chuck 55 is terminated, and the gas energizer 75 is operated at a reduced power level to provide an electrically conducting path from the substrate 20 to the chamber walls 35 to electrostatically decouple the substrate 20 from the electrostatic chuck 55. Thereafter, the substrate 20 is lifted from the receiving surface 50 of the electrostatic chuck 55 and removed from the chamber 25, and another substrate 20 is transported into the chamber 25 for processing.

Optionally, the position of the substrate 20 can continue to be monitored during processing so that if the substrate 20 shifts or otherwise moves during processing, such processing can be terminated before the substrate 20 is further damaged. In this embodiment, the sensor system 135 further includes a position indicator 230 that in response to a signal from the light sensor 160 continues to indicate proper or improper positioning of the substrate 20 during processing. The position indicator 230 maintains the chamber in an operational mode as long as a sufficient intensity of the light beam 150 is incident on the light sensor 160. When the light intensity is reduced due to a misplacement or movement of the substrate 20 so that the substrate 20 now covers up a portion of a window 155, the light sensor receives less light and signals the position indicator 230 to indicate a misplaced substrate 20, and cause the chamber 25 to be now maintained in a stand-by mode. A suitable position indicator 230 comprises a light emitting diode activated by a voltage that is turned on by a signal from the light sensor 160.

Figure 3A:
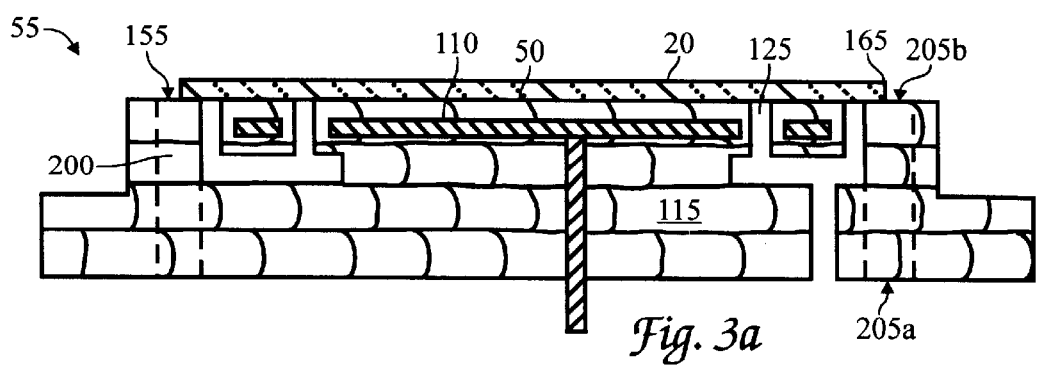
FIG. 3a is a schematic sectional side view of another embodiment of an electrostatic chuck according to the present invention.
Figure 3B:
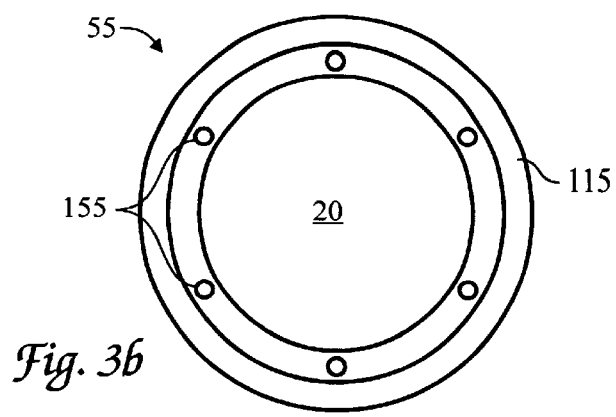

The sensor system 135 can also be adapted for detecting proper positioning of a substrate 20 in the chamber 25. For example, in the embodiment shown in FIG. 3b, the electrostatic chuck 55 comprises a plurality of windows 140 that are disposed about the peripheral edge 165 of the substrate 20. The windows 140 comprise from three to six inserts 180 that are evenly spaced apart around the peripheral edge 165 of the substrate 20. Typically, for a substrate 20 having a diameter of from about 150 to about 300 mm (6 to 12 inches), adjacent windows 140 are separated by an angle of from about 60 to about 120° as measured from the center of the electrostatic chuck 55. Preferably, when the entire surface or perimeter of the electrostatic chuck 55 is transparent, as shown in FIGS. 3a and 3b, the sensor system 135 comprises a plurality of radiation sources 135 and radiation sensors 150 that are evenly spaced about the peripheral edge 165 of the substrate 20 to monitor positioning of the substrate 20 with more accuracy. This embodiment maximizes the sensitivity of the sensor system 135 because if the substrate is even slightly improperly positioned, it will cover up one or more of the windows 140, and radiation will be blocked from at least one radiation sensor 150. In addition, because the entire surface or perimeter of the electrostatic chuck 55 is transparent, the radiation sources 135 and radiation sensors 150 can be easily repositioned to sense the position of substrates 20 having different shapes or sizes.

Figure 4:
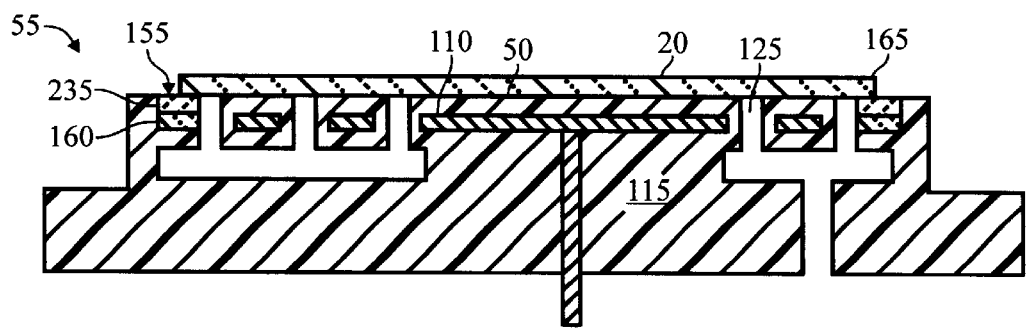
FIG. 4 is a schematic sectional side view of another embodiment of an electrostatic chuck according to the present invention.

In another embodiment, shown in FIG. 4, the window 155 does not extend through the entire thickness of the electrostatic chuck 55, but only through a top portion of the receiving surface 50 to expose a small radiation sensor 160 embedded immediately below the window 155. In addition, the window 155 comprises a small aperture 235 which allows only a beam of radiation 150 having a narrow and small diameter to reach the radiation sensor 160. Because of the small size of the aperture 235 and because the radiation sensor 160 is located near the receiving surface 50, only radiation which passes adjacent to the peripheral edge 165 of the substrate 20 is received by the radiation sensor 160. Thus, this embodiment relies on a radiation sensor 160 having an active area with a small cross-section to detect proper positioning of the substrate 20 by a radiation source 215 which provides a spread out beam of radiation 150 over the entire receiving surface 50, as shown in FIG. 5.

Figure 6:
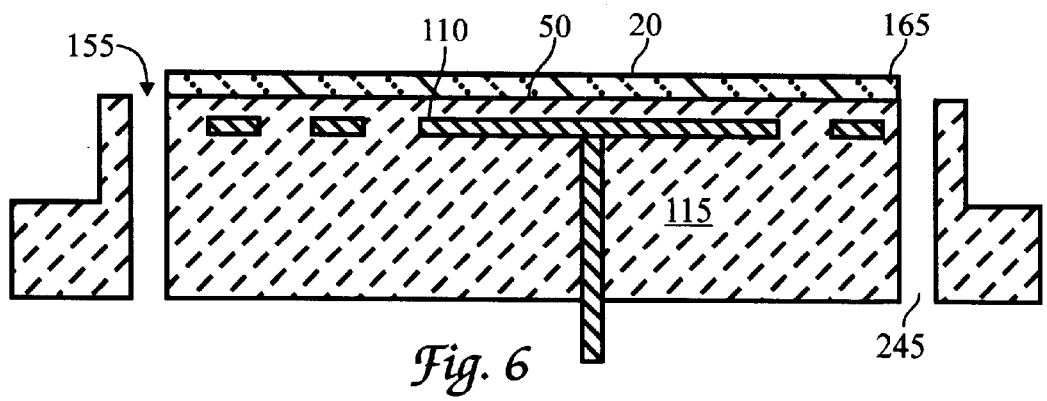
FIG. 6 is a schematic sectional side view of another embodiment of an electrostatic chuck having a window comprising a hole.
Figure 7A:
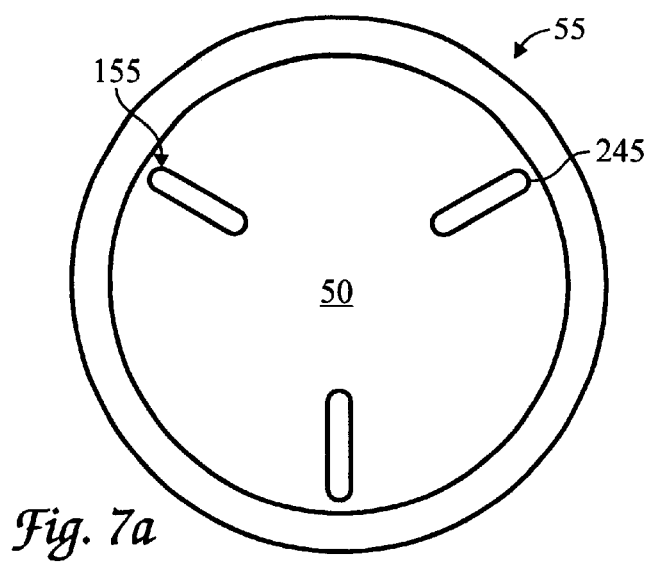
FIGS. 7a and 7b are schematic sectional top views of yet other embodiments of the electrostatic chuck of the present invention.
Figure 7B:
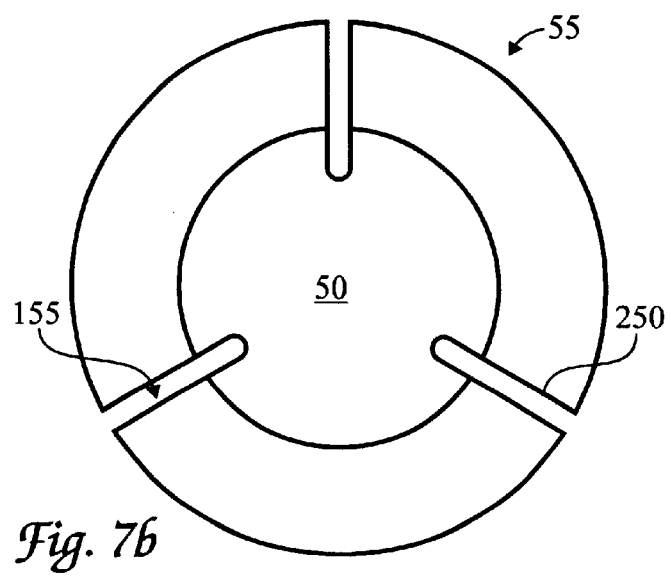

In yet another embodiment, shown in FIG. 6, the window 155 comprises a hole 245 which extends through the thickness of the chuck 55. This version is particularly useful for a chuck 55 comprising non-transparent material. In this embodiment, the window 155 comprises one or more holes 245 that are evenly spaced about the peripheral edge of the substrate 20. A suitable hole 245 comprises a circular opening having a diameter of from about 0.1 to about 10 mm. Because of its small size relative to its depth, it is necessary for only a narrow beam of radiation to pass an edge of a properly positioned substrate 20 and reach the radiation sensor 160. As shown in FIG. 7a, the hole 245 in the chuck 55 can also comprise a slot oriented along a direction in which the radiation source 140 or radiation sensor 160 can be moved to adjust the sensor system 135 for substrates 20 having different dimensions. The hole 245 extends through the entire thickness of the chuck 55. In another version, as shown in FIG. 7b, the chuck 55 comprises a cut-out 250 that is also shaped as a radially oriented slot and extends from the perimeter of the chuck toward the center. In both versions, the hole 245 or the cut-out 250 serve as a window 155 that allows radiation 150 to be transmitted therethrough for operation of the sensor system 135.

While the present invention has been described in considerable detail with reference to certain preferred versions, other versions should be apparent to those of ordinary skill in the art. For example, the present invention can be used in other chambers and for performing other types of processes. Therefore, the spirit and scope of the appended claims should not be limited to the description of the preferred versions contained herein.

What is claimed is:

1. An apparatus capable of detecting a proper positioning of a substrate on a support, the apparatus comprising:
   (a) a support adapted to support the substrate on a receiving surface, the support comprising a window adjacent to a peripheral edge of a properly positioned substrate, and the window comprising a material that is substantially transparent to a wavelength of a radiation comprising ultraviolet light, infra-red light, visible light or X-rays;
   (b) a radiation source adapted to project the radiation having the wavelength over the entire receiving surface of the support, and through the window in the support in a path adjacent to the peripheral edge of the substrate; and
   (c) a radiation sensor in a path of the radiation after the radiation passes through the window in the support, the radiation sensor adapted to detect a proper positioning of the substrate on the support by measuring an intensity of the radiation,
   wherein the radiation sensor and radiation source are positioned such that the radiation passing through the window reaches the radiation sensor when the substrate is properly positioned and the radiation is partially or entirely blocked by the substrate when the substrate is improperly positioned, or vice versa.

2. An apparatus according to claim 1 comprising a plurality of radiation sensors positioned about the peripheral edge of the substrate.

3. An apparatus according to claim 1 wherein the window comprises monocrystalline ceramic.

4. An apparatus according to claim 1 wherein the window comprises sapphire.

5. An apparatus according to claim 1 wherein the window comprises a polished surface.

6. An apparatus according to claim 1 wherein the window comprises a cut-out or a hole in the support.

7. An apparatus according to claim 1 further comprising a position indicator that in response to a signal from the radiation sensor indicates proper or improper positioning of the substrate.

8. An apparatus according to claim 1 wherein the support comprises an electrode and a DC voltage is applied to the electrode to electrostatically hold the substrate to the support upon detecting the presence of the substrate on the support.

9. An apparatus according to claim 1 wherein the radiation source is positioned in the support.

10. An apparatus according to claim 1 comprising a plurality of windows adjacent to the peripheral edge of a properly positioned substrate, wherein the radiation source is adapted to project the radiation through the windows and at least one radiation sensor is in a path of the radiation after the radiation passes through the windows.

11. An apparatus according to claim 1 wherein the window extends across the entire receiving surface or peripheral edge of the support.

12. A chamber capable of processing a substrate, the chamber comprising:
   (a) a gas distributor having a nozzle adapted to introduce process gas into the chamber;
   (b) a gas energizer adapted to energize the process gas to process the substrate;
   (c) an electrostatic chuck having a surface adapted to receive the substrate, and having a window adjacent to a peripheral edge of a properly positioned substrate, the window comprising a material that is adapted to transmit a wavelength of a radiation therethrough, the radiation comprising ultraviolet light, infra-red light, visible light or X-rays;
   (d) a radiation source adapted to pass the radiation having the wavelength through the window of the electrostatic chuck;
   (e) a radiation sensor in a path of the radiation after the radiation passes through the window, the radiation sensor adapted to detect a proper positioning of the substrate on the surface of the electrostatic chuck by measuring an intensity of the radiation, and to generate a signal corresponding to whether the substrate is properly positioned; and
   (f) a position indicator adapted to receive the signal from the radiation sensor during processing of the substrate, and to terminate processing of the substrate if the signal indicates that the substrate has become improperly positioned,
   wherein the radiation sensor and radiation source are positioned such that the radiation passing through the window reaches the radiation sensor when the substrate is properly positioned and the radiation is partially or entirely blocked by the substrate when the substrate is improperly positioned, or vice versa.

13. A chamber according to claim 12 comprising a plurality of radiation sensors.

14. A chamber according to claim 12 wherein the window comprises monocrystalline ceramic.

15. A chamber according to claim 12 wherein the electrostatic chuck comprises an electrode and a DC voltage is applied to the electrode to electrostatically hold the substrate to the surface of the electrostatic chuck upon detecting the substrate on the surface of the electrostatic chuck.

16. A chamber according to claim 12 wherein the radiation source is positioned in the electrostatic chuck.

17. A chamber according to claim 12 comprising a gas energizer to energize the process gas to form a plasma that emits a spectral emission, and wherein the radiation source is adapted to provide, and the radiation detector is adapted to detect, wavelengths that are different from wavelengths of the spectral emission.

18. A chamber according to claim 12 wherein the window extends across the entire surface or peripheral edge of the electrostatic chuck.

19. An electrostatic chuck capable of holding a substrate, the electrostatic chuck comprising
(a) a dielectric having a surface adapted to receive a substrate, the dielectric covering an electrode that is chargeable to electrostatically hold the substrate, and the dielectric comprising a window positioned adjacent to a peripheral edge of a properly positioned substrate, the window comprising a material that is substantially transparent to a wavelength of a radiation comprising ultraviolet light, infra-red light, visible light or X-rays; and
(b) a sensor system adapted to, upon sensing a proper positioning of the substrate on the electrostatic chuck, allow a DC clamping voltage to be applied to the electrode to clamp the substrate to the surface of the dielectric,
whereby when the substrate is properly positioned on the surface of the dielectric, the radiation is transmitted through the window, and when the substrate is improperly positioned, the radiation is partially or entirely blocked by the substrate, or vice versa.

20. An electrostatic chuck according to claim 19 further comprising a plurality of windows positioned about the peripheral edge of the substrate.

21. An electrostatic chuck according to claim 19 wherein the window comprises monocrystalline ceramic.

22. An electrostatic chuck according to claim 19 wherein the window comprises sapphire.

23. An electrostatic chuck according to claim 19 wherein the window comprises a surface having a peak-to-peak RMS roughness that is sufficiently small to allow radiation to be transmitted therethrough.

24. An electrostatic chuck according to claim 19 wherein the window comprises a cut-out or a hole.

25. An electrostatic chuck according to claim 19 wherein a DC voltage is applied to the electrode to electrostatically hold the substrate to the surface of the electrostatic chuck upon detecting an intensity of the radiation transmitted through the window.

26. An electrostatic chuck according to claim 19 wherein the radiation is transmitted from the electrostatic chuck.

27. An electrostatic chuck according to claim 19 wherein the window extends across the entire surface or peripheral edge of the dielectric.

28. An apparatus capable of detecting a presence of a substrate on a support, the apparatus comprising:
(a) a support adapted to support the substrate, the support comprising a plurality of windows arranged adjacent to a peripheral edge of a properly positioned substrate such that adjacent windows are separated by an angle of from about 60 to about 120° as measured from a center of the support, the windows comprising a material that is substantially transparent to a wavelength of a radiation comprising ultraviolet light, infra-red light, visible light or X-rays;
(b) at least one radiation source adapted to direct the radiation having the wavelength through the windows in the support in a path adjacent to the peripheral edge of the substrate; and
(c) at least one radiation sensor in a path of the radiation after the radiation passes through the windows in the support, the radiation sensor adapted to detect a presence of the substrate on the support by measuring an intensity of the radiation,
wherein the radiation sensor and radiation source are positioned such that the radiation passing through the windows reaches the radiation sensor when the substrate is properly positioned and the radiation is partially or entirely blocked by the substrate when the substrate is improperly positioned, or vice versa.

29. A chamber capable of processing a substrate, the chamber comprising:
(a) a gas distributor having a nozzle adapted to introduce process gas into the chamber;
(b) a gas energizer adapted to energize the process gas to process the substrate;
(c) a support adapted to support the substrate, the support comprising an electrostatic chuck having a dielectric that has a receiving surface to receive the substrate, the dielectric covering an electrode that is chargeable to electrostatically hold the substrate, and the dielectric comprising a material that is substantially transparent to a wavelength of a radiation comprising ultraviolet light, infra-red light, visible light or X-rays;
(d) a radiation source adapted to pass the radiation having the wavelength through the dielectric of the electrostatic chuck; and
(e) a radiation sensor in a path of the radiation after the radiation passes through the, dielectric of the electrostatic chuck, the radiation sensor adapted to detect a proper positioning of the substrate on the receiving surface of the support by measuring an intensity of the radiation,
wherein the radiation sensor and radiation source are positioned such that the radiation passing through the window reaches the radiation sensor when the substrate is properly positioned and the radiation is partially or entirely blocked by the substrate when the substrate is improperly positioned, or vice versa.

30. A chamber according to claim 29 wherein the dielectric comprises monocrystalline ceramic.

31. A chamber according to claim 29 wherein the dielectric comprises sapphire.

32. A chamber according to claim 29 further comprising a plurality of radiation sensors in the electrostatic chuck, in a path of the radiation after the radiation passes through the dielectric of the electrostatic chuck.

* * * * *